United States Patent [19]
Pike et al.

[11] Patent Number: 5,940,651
[45] Date of Patent: Aug. 17, 1999

[54] DRIP CATCHING APPARATUS FOR RECEIVING EXCESS PHOTORESIST DEVELOPER SOLUTION

[75] Inventors: Christopher Lee Pike, Fremont; David Ashby Steele, Sunnyvale, both of Calif.

[73] Assignee: Advanced Micro Devices, Inc., Sunnyvale, Calif.

[21] Appl. No.: 09/023,853

[22] Filed: Feb. 13, 1998

[51] Int. Cl.[6] ..................................................... G03D 5/00
[52] U.S. Cl. ..................... 396/604; 396/611; 396/627; 118/52; 156/345; 427/240
[58] Field of Search .................. 355/43–45, 53; 396/604, 611, 627; 250/548; 118/52; 134/33, 34, 157

[56] References Cited

U.S. PATENT DOCUMENTS

| | | | |
|---|---|---|---|
| 5,591,264 | 1/1997 | Sugimoto et al. | 118/52 |
| 5,611,886 | 3/1997 | Bachman et al. | 156/345 |
| 5,705,223 | 1/1998 | Bunkofske | 427/240 |

*Primary Examiner*—D. Rutledge
*Attorney, Agent, or Firm*—Fliesler, Dubb, Meyer & Lovejoy

[57] ABSTRACT

A drip catching apparatus includes a trough 2 formed by a sidewall 26 and a drip catching surface 28 to prevent excess drops of a photoresist developer solution from dripping onto a semiconductor wafer 8 in a photoresist development cup 4. One or more holes 30 may be provided to drain the photoresist developer solution received by the drip trough 2.

82 Claims, 2 Drawing Sheets

DRIP CATCHING APPARATUS FOR RECEIVING EXCESS PHOTORESIST DEVELOPER SOLUTION

TECHNICAL FIELD

The present invention relates to an apparatus for applying a photoresist developer solution to a semiconductor wafer, and more particularly, to an apparatus for catching drips of the photoresist developer solution in a photoresist development cup.

BACKGROUND ART

Conventional photoresist development apparatus for the application of photoresist developer solutions to semiconductor wafers have been extensively used in the fabrication of semiconductor integrated circuits and are well known in the semiconductor processing industry. A conventional apparatus for applying a photoresist developer solution to a semiconductor wafer typically includes a photoresist development cup in which the semiconductor wafer is secured horizontally to receive the photoresist developer solution, typically from a developer dispense nozzle which applies droplets of the developer solution to the surface of the semiconductor wafer. In general, a wafer holder is connected to a motor which is typically attached to the base of the photoresist development cup such that the wafer can be spun by the motor during the photoresist development process. The wafer holder is positioned to hold the semiconductor wafer in a horizontal position. The photoresist development cup may further include a deflecting surface with a downward sloped surface immediately adjacent the edges of the wafer to drain excess photoresist developer solution from the surface of the wafer.

The conventional apparatus for applying a photoresist developer solution to a semiconductor wafer may also include a drip guard which usually has a flat annular surface on the top of the photoresist development cup to block drops of the photoresist developer solution dripping from the dispense nozzle when the nozzle moves between positions outside the cup and above the center opening in the flat annular drip guard. When the developer dispense nozzle is positioned directly above the center opening, it is able to move into the cup and to spray droplets of the developer solution onto the surface of the wafer.

The conventional flat strip guard is supposed to prevent excess drops of the photoresist developer solution dripping from the developer dispense nozzle from splashing onto the wafer. In practice, however, some of the photoresist developer solution caught by the conventional flat drip guard often drips from the edge of the drip guard back into the photoresist development cup, thereby allowing the surface of the wafer to accumulate an excess amount of the photoresist development solution. Furthermore, the excess photoresist developer solution dripping back into the photoresist development cup from the conventional flat drip guard often accumulates near the edge of the wafer, thereby causing an uneven distribution of the photoresist developer solution across the surface of the wafer.

Therefore, there is a need for a photoresist drip catching apparatus that prevents excess drops of the photoresist developer solution on the dispense nozzle from splashing onto the surface near the edge of the wafer after a desired amount of the photoresist developer solution has been applied to the surface of the wafer. Furthermore, there is a need to be able to drain the excess photoresist developer solution from the drip catching apparatus.

DISCLOSURE OF THE INVENTION

The present invention satisfies these needs. In accordance with the present invention, a photoresist drip catching apparatus generally comprises:

(a) a cup defined by a base, a sidewall and an open top;
(b) a wafer holder on the base of the cup;
(c) a drip trough connected to the sidewall of the cup, the drip trough having a drip catching surface facing the open top and extending from the sidewall of the cup.

In an embodiment, at least one hole in the drip catching surface of the drip trough is provided to drain the photoresist developer solution accumulated in the drip trough. The drip trough may be an annular trough immediately adjacent the sidewall of the photoresist development cup with a drip catching surface forming an acute angle with the sidewall of the cup to receive drops of the photoresist developer solution when the developer dispense nozzle moves from the open top toward the sidewall of the cup. Alternatively, two drip troughs each of a substantially semi-annular shape may be provided on the sidewall of the cup to receive the drops of the photoresist developer solution, with each trough including at least one hole in the drip catching surface to drain the photoresist developer solution accumulated in the trough.

The wafer holder on the base of the photoresist development cup is positioned to hold a semiconductor wafer in a horizontal position to receive droplets of photoresist developer solution from a developer dispense nozzle which may be movable with respect to the open top of the photoresist development cup and capable of being positioned to dispense the photoresist developer solution onto the wafer. The apparatus may further comprise a deflecting surface on the base of the photoresist development cup below the drip trough, wherein the deflecting surface is positioned to deflect the photoresist developer solution that is spun off from the surface of the wafer as the wafer holder is rotated by the motor.

The drip catching apparatus according to the present invention may be formed as an integral part of the photoresist development cup or may be provided as a separate drip catch that may be attached and removed from the open top of the photoresist development cup. The photoresist drip catch may comprise an annular trough with a sidewall and a drip catching surface formed at an acute angle with the sidewall, and may further include at least one hole in the drip catching surface to drain the photoresist developer solution accumulated in the trough. Alternatively, the drip catch may comprise two substantially semi-annular troughs connected to each other, each of the troughs comprising a sidewall and a drip catching surface forming an acute angle with the sidewall, each of the troughs further including at least one hole in the drip catching surface adjacent the sidewall.

Advantageously, the present invention provides a drip catching apparatus for receiving excess drops of the photoresist developer solution dripping from the developer dispense nozzle to prevent the excess drops from splashing back into the photoresist development cup where the excess photoresist developer solution could otherwise land on the wafer surface. Another advantage of the present invention is that the hole in the drip catching surface is positioned to drain the photoresist developer solution accumulated in the drip trough downward along the sidewall of the photoresist development cup and away from the edge of the wafer, thereby allowing the excess photoresist developer solution to be drained from the drip trough without splashing onto the surface of the wafer. Alternatively, a drain line may be attached to the hole to drain the photoresist developer solution from the drip trough.

BRIEF DESCRIPTION OF THE DRAWINGS

The present invention will be described with respect to particular embodiments thereof, and references will be made to the drawings in which.

MODES FOR CARRYING OUT THE INVENTION

The present invention provides an apparatus for applying a photoresist developer solution to a semiconductor wafer, and more particularly, a photoresist drip catching apparatus for preventing excess drops of the photoresist developer solution from dripping onto the surface of the semiconductor wafer.

Figure 1:
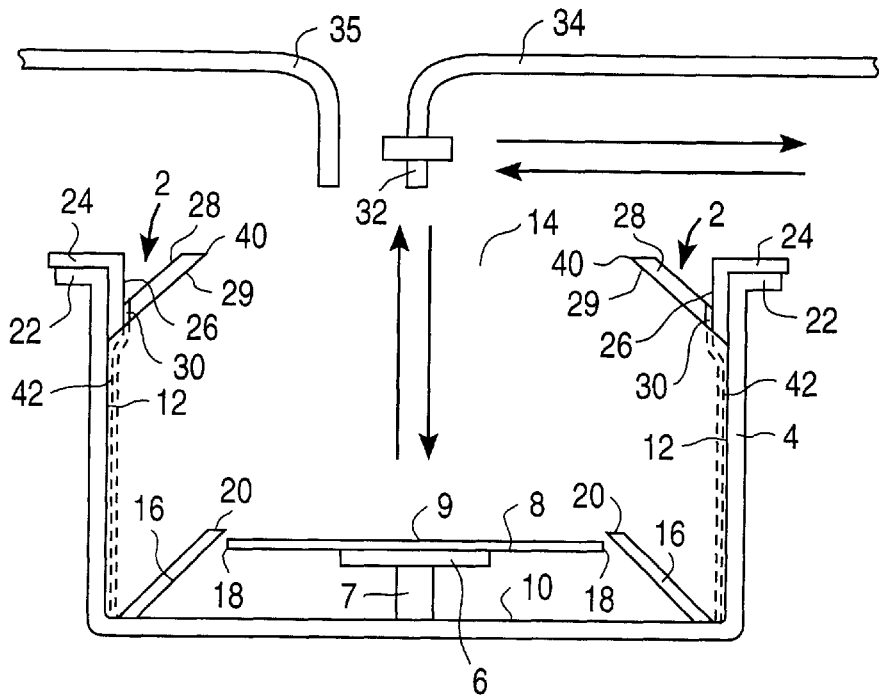
FIG. 1 is a side sectional view of an apparatus for applying a photoresist developer solution to a semiconductor wafer in accordance with the present invention.

FIG. 1 is a side sectional view of an embodiment of an apparatus for applying a photoresist developer solution to a semiconductor wafer in accordance with the present invention. In this embodiment, a drip trough 2 is attached to a photoresist development cup 4 within which a wafer holder 6 is positioned to support a semiconductor wafer 8 in a horizontal position. The photoresist development cup 4, which is usually of a cylindrical shape, has a base 10, a sidewall 12 which is perpendicular to the base 10, and an open top 14 which is opposite the base 10. The wafer holder 6 is attached to a motor 7 such that the wafer 8 can be spun by the motor 7 during the dispensing of the photoresist developer solution as well as during the water rinse. The motor 7 is usually attached to the base 10 of the photoresist development cup 4, and a deflecting surface 16 is usually also provided on the base 10 of the photoresist development cup 4 adjacent to the edge 18 of the semiconductor wafer 8. The wafer 8 which is placed on the wafer holder 6 may be spun by the motor 7 which causes the wafer 8 and the wafer holder 6 to rotate while the photoresist developer solution or water is dispensed onto the wafer surface 9. The wafer 8 can also be spun to dry its surface 9.

The deflecting surface 16 has an edge 20 which is positioned slightly higher than the surface 9 of the wafer 8 and is angled downward from the edge 18 of the wafer 8 toward the base 10 near the sidewall 12 of the photoresist development cup 4. When the photoresist developer solution is applied to the surface 9 of the wafer 8, the developer solution is spun off the wafer 8 by the rotation of the motor 7. The developer solution spun off the wafer 8 contacts the deflecting surface 16 which deflects the solution downward toward the base 10 and away from the wafer surface 9. Neither the deflecting surface 16 nor its edge 20 is in contact with the edge 18 of the wafer at any time during the photoresist development process. The developer solution, which may otherwise puddle on the surface 9 of the wafer 8, is spun off from the wafer 8 by the motor 7 and deflected away from the wafer 8 by the deflecting surface 16, thus evenly distributing the solution over the surface 9 of the wafer 8. The excess amount of photoresist developer solution accumulated between the sidewall 12 of the photoresist development cup 4 and the deflecting surface 16 can be drained from the photoresist development cup 4. The cup 4, the wafer holder 6 and the deflecting surface 16 are conventional and known to a person skilled in the art.

In the embodiment shown in FIG. 1, the drip trough 2 is provided as a separate piece attached to the sidewall 12 of the photoresist development cup 4. The photoresist development cup 4 may include a lip 22 extending outward from the sidewall 12 to define the open top 14 of the cup 4. The drip trough 2 may include a tab 24 which is adapted for attachment to the lip 22 of the photoresist development cup 4. The drip trough 2 has a sidewall 26 which may be perpendicular to the base 10 of the photoresist development cup 4 and an angled drip catching surface 28 which intersects the sidewall 26 of the drip trough 2 at an acute angle. The drip catching surface 28 is positioned to face the open top 14 of the cup 4 at an angle and extends upward from the sidewall 26 of the drip trough 2 to the open top 14 of the photoresist development cup 4. Furthermore, one or more holes 30 may be provided in the drip catching surface 28 adjacent the sidewall 26 of the drip trough 2 to drain the photoresist developer solution from the drip trough 2.

The apparatus according to the present invention may also include a photoresist developer dispense nozzle 32 for dispensing droplets of the photoresist developer solution onto the surface of the semiconductor wafer 8 in the photoresist development cup 4. The developer dispense nozzle 32 is usually movable with respect to photoresist development cup 4 and can usually be moved in both horizontal and vertical directions. The developer dispense nozzle 32 may be supplied with the photoresist development solution from a flexible tube 34 which allows the nozzle 32 to move to and from the open top 14 of the photoresist development cup 4. When the developer dispense nozzle 32 is not in use, it may be caused to move away from the open top 14 of the photoresist development cup 4. When the developer dispense nozzle 32 is positioned directly above the open top 14 of photoresist development cup 4, it may move downward into the cup 4 to a position close to the semiconductor wafer 8 before it dispenses droplets of the photoresist developer solution onto the wafer 8.

After the developer dispense nozzle 32 finishes dispensing the photoresist developer solution onto the wafer 8, it may be retracted from the photoresist development cup 4 by moving upward and then horizontally away from the open top 14 of the photoresist development cup 4 to a resting position outside the sidewall 12 of the cup 4. After the dispense nozzle 32, which may be a conventional nozzle known to a person skilled in the art, is shut off after spraying droplets of the photoresist developer solution onto the wafer 8, excess drops of the photoresist developer solution may remain on the nozzle 32. When the nozzle 32 is retracted from a position directly above the open top 14 of the photoresist development cup 4 to a position outside the sidewall 12 of the cup 4, the remaining photoresist developer solution on the nozzle 32 may undesirably drip from the nozzle 32. The excess drops of the solution may land on the edge 20 of the deflecting surface 16 and the surface 9 of the wafer 8 near its edge 18 if the drip trough 2 according to the present invention is not provided.

In an additional embodiment, a water rinse nozzle 35 may be provided to rinse the surface 9 of the wafer 8 with water after the application of the potoresist developer solution to the wafer 8. The water rinse nozzle 35 may be positioned above the open top 14 of the photoresist development cup 4 to rinse the surface 9 of the wafer 8 with pure water. The water accumulated on the surface 9 of the wafer 8 may also be spun off from the wafer surface 9 by the rotation of the motor 7, and the water spun off the wafer 8 contacts the deflecting surface 16 and is deflected downward toward the base 10 of the cup 4 and away from the wafer surface 9. The water rinse nozzle 35 may be a conventional nozzle known to a person skilled in the art.

The drip trough 2 with the angled drip catching surface 28 is positioned to receive the excess drops of the photoresist developer solution from the dispense nozzle 32 when it moves from the open top 14 toward the sidewall 12 of the cup 4 to prevent these excess drops of the solution from splashing onto the surface near the edge 18 of the wafer 8. Moreover, at least one hole 30 may be provided in the drip catching surface 28 of the drip trough 2 to drain the photoresist developer solution which may have accumulated in the trough 2. Furthermore, the hole 30 may be positioned adjacent the sidewall 26 of the drip trough 2, for example, at the intersection of the sidewall 26 and the angled drip catching surface 28 such that the photoresist developer solution which has drained from the trough 2 may flow along the sidewall 12 of the photoresist development cup 4 downward to the base 10 of the cup 4, which also receives the excess photoresist developer solution from the deflecting surface 16 for draining the excess solution from the surface 9 of the wafer 8. The excess photoresist developer solution accumulated on the base 10 may be drained from the cup 4 in a conventional manner known to a person skilled in the art.

The drip trough 2 according to the present invention also has an outside surface 29 outside of the angled drip catching surface 28. The photoresist developer solution on the tip 40 of the drip trough 2 is pulled downward by gravity along the outside surface 29 and is thus prevented from dripping onto the wafer 8 from the tip 40 of the trough 2. In an additional embodiment, a drain line 42 may be optionally connected to the hole 30 to drain the excess photoresist developer solution from the drip trough 2 if draining the solution onto the sidewall 12 of the photoresist development cup 4 is undesirable. The drain line 42 may be provided to drain the photoresist developer solution to the base 10 of the cup 4, or to direct the solution to outside the cup 4. For a drip trough 2 with a plurality of holes 30, a plurality of drain lines 42 may be attached to the respective holes 30.

Figure 2:
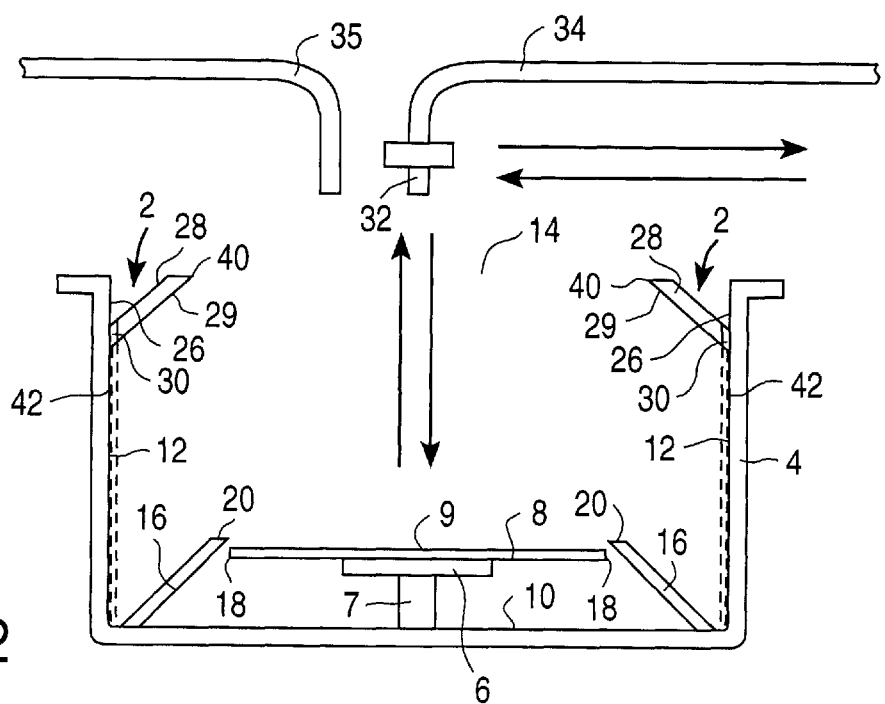
FIG. 2 is a side sectional view of another embodiment of the apparatus in accordance with the present invention in which the drip catch is formed as an integral part of the photoresist development cup.

FIG. 2 is a side sectional view of another embodiment of the apparatus according to the present invention in which the drip trough 2 is formed as an integral part of the photoresist development cup 4. In this embodiment, the wafer holder 6 and the deflecting surface 16 are provided on the base 10 of photoresist development cup 4 in the same manner as that which is shown in FIG. 1 and described above. The wafer holder 6 is adapted to support the semiconductor wafer 8 in a horizontal position. A motor 7 is connected to the wafer holder 6 to spin the wafer 8. In a manner similar to that which is shown in FIG. 1 and described above, the developer solution on the surface 9 of the wafer 8 is spun off the wafer 8 by the rotation of the motor 7. The developer solution that has been spun off the wafer 8 hits the deflecting surface 16 which deflects the solution downward toward the base 10 of the cup 4 and away from the wafer surface 9. Neither the deflecting surface 16 nor its edge 20 is in contact with the edge 18 of the wafer 8 at any time during the photoresist development process. The excess photoresist developer solution accumulated on the base 10 of the photoresist development cup 4 can be drained from the cup 4 in a conventional manner known to a person skilled in the art.

The drip trough 2 is formed by an upper portion 26 of the sidewall 12 near the open top 14 of the photoresist development cup 4 and a drip catching surface 28, which extends upward from the sidewall 12 of the cup 4 and faces the open top 14 of the cup 4 at an angle. The angled drip catching surface 28 is directly connected to the sidewall 12 of the photoresist development cup 4, and the upper portion 26 of the sidewall 12 forms an acute angle with the drip catching surface 28. Furthermore, one or more holes 30 may be provided in the drip catching surface 28 to drain the photoresist developer solution from the drip trough 2. The holes 30 may be positioned immediately adjacent the sidewall 12 of the cup 4, that is, at the intersection of the upper portion 26 of the sidewall 12 and the drip catching surface 28. The photoresist developer solution drained from the drip trough 2 can thus be directed to flow downward along the sidewall 12 to the base 10 of the photoresist development cup 4. Since the holes 30 are located immediately adjacent the sidewall 12 of the photoresist development cup 4 and away from the edge 20 of the deflecting surface 16, the photoresist developer solution drained from the drip trough 2 will not splash onto the edge 20 of the deflecting surface 16 or the edge 18 of the surface 9 of the wafer 8, thereby preventing an undesirable excess amount of the photoresist developer solution from being applied to the surface 9 of the wafer 8 near the edge 18.

In this embodiment, a conventional photoresist developer dispense nozzle 32 may be provided to dispense droplets of the photoresist developer solution onto the surface 9 of the wafer 8 in the same manner as that which is shown in FIG. 1 and described above. In FIG. 2, the dispense nozzle 32, which is attached to a flexible tube 34, is movable both horizontally and vertically with respect to the photoresist development cup 4. For example, the dispense nozzle 32 can move horizontally from a resting position outside the photoresist development cup 4 toward the open top 14 of the cup 4 and then downward into the cup 4 before it sprays droplets of the photoresist developer solution onto the semiconductor wafer 8. After the application of the photoresist developer solution is finished, the flow of the developer solution to the dispense nozzle 32 is shut off and the nozzle 32 moves upward and then horizontally from the open top 14 of the photoresist development cup 4 to a resting position outside the cup 4. In an additional embodiment, a wafer rinse nozzle 35 may be provided to rinse the surface 9 of the wafer 8 with pure water after the application of the photoresist developer solution to the wafer 8. The water on the surface 9 of the wafer 8 may also be spun off by the rotation of the motor 7.

After the flow of the photoresist developer solution is shut off, some excess amount of the photoresist developer solution may remain on the dispense nozzle 32. When the dispense nozzle 32 moves from the open top 14 of the photoresist development cup 4 toward the sidewall 12 of the cup 4, the excess photoresist developer solution on the dispense nozzle 32 may drip into the cup 4. The drip catching surface 28 of the drip trough 2, which is positioned above the deflecting surface 16, is able to catch the photoresist developer solution dripping from the dispense nozzle 32 when the nozzle 32 moves across the top of the drip trough 2 to prevent the dripping photoresist developer solution from reaching the edge 20 of the deflecting surface 16 or the edge 18 of the wafer 8, thereby preventing these excess drops of the photoresist developer solution from splashing onto the surface near the edge 18 of the semiconductor wafer 8.

The drip trough 2 according to the present invention also has an outside surface 29 outside of the angled drip catching surface 28. The photoresist developer solution on the tip 40 of the drip trough 2 is pulled downward by gravity along the outside surface 29 and is thus prevented from dripping onto the wafer 8 from the tip 40 of the trough 2. In a further embodiment, a drain line 42 may be optionally connected to the hole 30 to drain the excess photoresist developer solution from the drip trough 2 if draining the solution onto the sidewall 12 of the photoresist development cup 4 is undesirable. The drain line 42 may be provided to drain the photoresist developer solution to the base 10 of the cup 4, or to direct the solution to outside the cup 4. For a drip trough 2 with a plurality of holes 30, a plurality of drain lines 42 may be attached to the respective holes 30.

Figure 3:
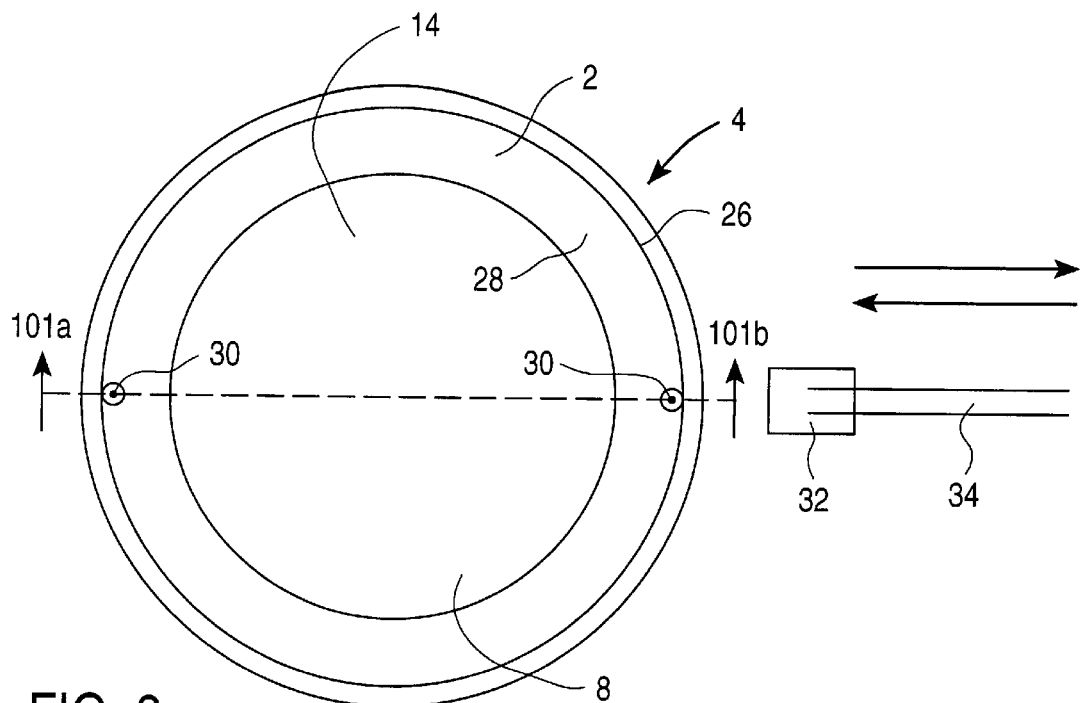
FIG. 3 is a top plan view of an embodiment of the apparatus of FIG. 1 or FIG. 2 in which an annular drip trough is provided in accordance with the present invention.

FIG. 3 is a top plan view of an embodiment of the drip catching apparatus of either FIG. 1 or FIG. 2 according to the present invention. In this embodiment, the photoresist development cup 4 is cylindrical and the drip trough 2 has a substantially annular shape in the top plan view. The side sectional view of the drip catching apparatus 2 of either FIG. 1 or FIG. 2 can be regarded as a sectional view made from a cross-sectional cut along sectional line 101a–101b in FIG. 3. The drip trough 2 is formed by the sidewall 26 and the angled drip catching surface 28 to receive excess drops of the photoresist developer solution from the dispense nozzle 32, shown in FIG. 3 in a resting position outside the photoresist development cup 4, after the nozzle 32 moves from the open top 14 of the cup 4 to the resting position outside the cup 4. In the top plan view of FIG. 3, the semiconductor wafer 8 is visible through the open top 14 of the photoresist development cup 4. FIG. 3 also shows two holes 30 in the drip catching surface 28 immediately adjacent the sidewall 26 for draining the photoresist developer solution accumulated in the drip trough 2. One or more drain holes 30 may be provided in the drip catching surface 28 immediately adjacent the sidewall 26 of the drip trough 2.

Figure 4:
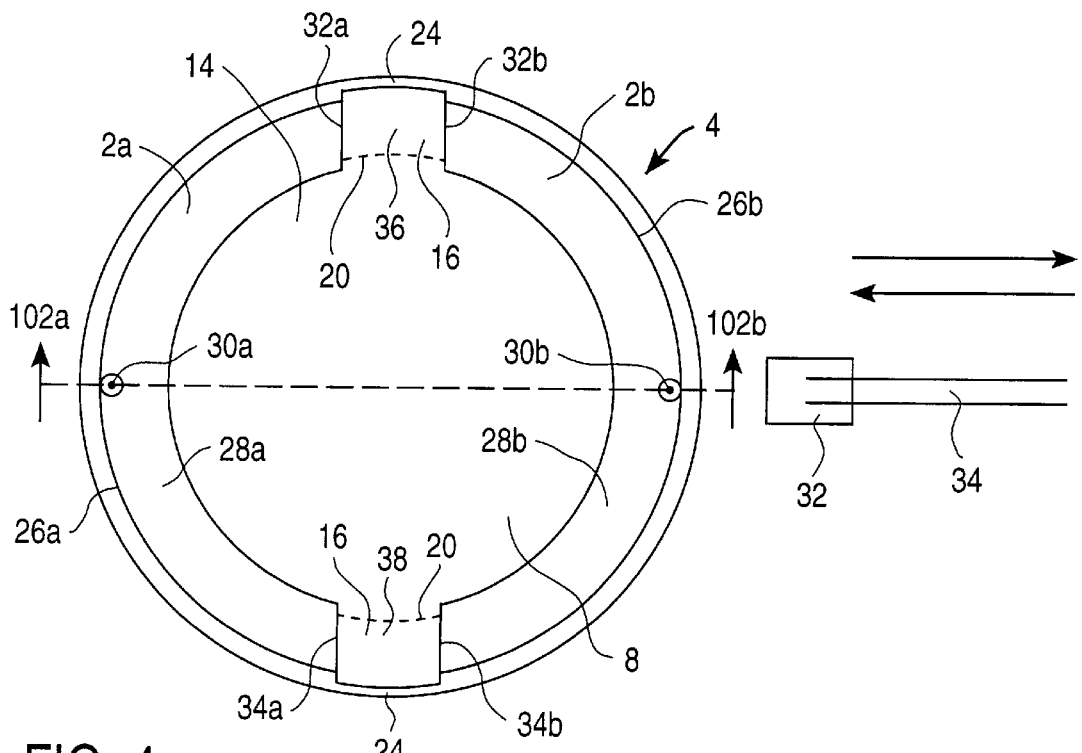
FIG. 4 is a top plan view of another embodiment of the drip catching apparatus of FIG. 1 or FIG. 2 in which two semi-annular drip troughs are provided in accordance with the present invention.

FIG. 4 shows a top plan view of another embodiment of the drip catching apparatus of either FIG. 1 or FIG. 2 according to the present invention with two substantially semi-annular troughs 2a and 2b substantially symmetrical with respect to each other in the top plan view of FIG. 4. The two drip troughs 2a and 2b have respective ends 32a, 34a and 32b, 34b connected through the tab 24, which may be an annular ring along the top of the cylindrical sidewall 12 of the photoresist development cup 4. The semi-annular troughs 2a and 2b have respective drip catching surfaces 28a and 28b each forming an acute angle with the respective sidewalls 26a and 26b of the drip troughs 2a and 2b. The drip troughs 2a and 2b may further include respective holes 30a and 30b in the respective drip catching surfaces 28a and 28b immediately adjacent the respective sidewalls 26a and 26b for draining the photoresist developer solution accumulated in the drip troughs 2a and 2b. Although FIG. 4 shows one drain hole in each trough, more than one drain hole may be provided in the drip catching surface of each of the semi-annular troughs.

The side sectional view of either FIG. 1 or FIG. 2 may also be obtained by cutting the drip catching apparatus along sectional line 102a–102b of FIG. 4. In the top plan view of FIG. 4, the surface of the semiconductor wafer 8 is visible through the open top 14 of the photoresist development cup 4. Moreover, the gaps 36 and 38 formed by the ends 32a, 32b and 34a, 34b allow the deflecting surface 16 to be visible through the open top 14 of the photoresist development cup 4. The deflecting surface 16 of either FIG. 1 or FIG. 2 may be an annular ramp immediately surrounding the edge 18 of the semiconductor wafer 8. The edge 20 of the deflecting surface 16 is shown in FIG. 4 as dashed curves 20 to indicate that the edge 20 of the deflecting surface 16 is visible through the gaps 36 and 38. In the top plan view of FIG. 4, the photoresist developer dispense nozzle 32 is shown in a resting position outside the photoresist development cup 4.

Figure 5:
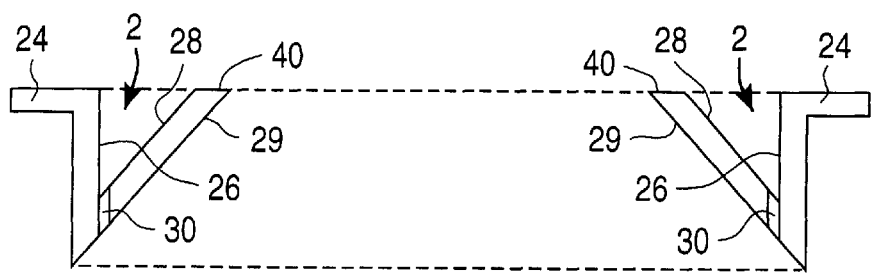
FIG. 5 is a side sectional view of a drip catch with a sidewall and a drip catching surface formed at an acute angle with respect to the sidewall in accordance with the present invention.

The present invention also provides a drip catch, a side sectional view of which is shown in FIG. 5, for catching excess drops of the photoresist developer solution. The drip catch comprises a trough 2 formed by a trough sidewall 26 and a drip catching surface 28 which is immediately connected to the sidewall 26 and intersects the sidewall 26 at an acute angle. One or more holes 30 may be provided in the drip catching surface 28 immediately adjacent the sidewall 26 for draining the photoresist developer solution accumulated in the drip trough 2. The drip catch may further include a tab 24 which can be securely attached to the top of the photoresist development cup 4 in FIG. 1, for example, by placing the tab 24 of the drip catch of FIG. 5 on top of the lip 22 of the photoresist development cup 4 in FIG. 1. The side sectional view of FIG. 5 is applicable to a drip catch comprising either the annular trough 2 shown in the top plan view of FIG. 3 or the two substantially semi-annular troughs 2a and 2b shown in the top plan view of FIG. 4. The side sectional view of the drip catch in FIG. 5 may be obtained by cutting the drip catch along either the sectional line 101a–101b in the top plan view of FIG. 3 or the sectional line 102a–102b in the top plan view of FIG. 4.

In the embodiments shown in FIGS. 1–5 and described above, it was assumed that the drip catching surface 28 forms an acute angle with respect to the sidewall 26 of the drip trough 2. However, this assumption is not mandatory in a different embodiment. For example, the drip catching surface 28 may also be a curved surface which, together with the sidewall 26, forms a drip trough 2 that serves to receive excess drops of the photoresist developer solution dripping from the dispense nozzle 32. It was also assumed that the drip catch comprises either an annular trough 2 as shown in FIG. 3 or two semi-annular troughs 2a and 2b as shown in FIG. 4 at the top of the photoresist development cup 4. None of these assumptions are mandatory in a different embodiment. It will be appreciated that a drip catching apparatus with another physical shape can be developed to the extent that an embodiment deviates from these assumptions. The principles of the present invention would nonetheless still apply.

INDUSTRIAL APPLICABILITY

The apparatus according to the present invention is applicable to the photoresist development of semiconductor wafers in the fabrication of semiconductor integrated circuits. The apparatus is believed to be superior to a conventional flat drip guard which is provided on the top of a conventional photoresist development cup. The drip catching apparatus according to the present invention is expected to be able to prevent the excess photoresist developer solution from dripping onto the wafer surface 9 more effectively than the conventional drip guard.

The invention has been described with respect to particular embodiments thereof, and numerous modifications can be made which are within the scope of the invention as set forth in the claims.

What is claimed is:

1. An apparatus, comprising:
   (a) a cup defined by a base, a sidewall and an open top;
   (b) a wafer holder on the base of the cup;
   (c) a drip trough connected to the sidewall of the cup, the drip trough having a drip catching surface facing the open top and extending from the sidewall of the cup.

2. The apparatus of claim 1, further comprising a dispense nozzle capable of being positioned to dispense a developer solution onto the wafer holder.

3. The apparatus of claim 2, wherein the dispense nozzle is movable with respect to the cup.

4. The apparatus of claim 1, wherein the drip trough further includes at least one hole in the drip catching surface.

5. The apparatus of claim 4, wherein the at least one hole is positioned adjacent the sidewall of the cup.

6. The apparatus of claim 4, further comprising a drain line connected to the least one hole.

7. The apparatus of claim 1, wherein the drip catching surface forms an acute angle with the sidewall of the cup.

8. The apparatus of claim 1, wherein the drip catching surface is positioned to extend upward from the sidewall to the open top of the cup.

9. The apparatus of claim 1, wherein the wafer holder is adapted to support a semiconductor wafer.

10. The apparatus of claim 9, further comprising a dispense nozzle capable of being positioned to dispense a photoresist developer solution onto the semiconductor wafer.

11. The apparatus of claim 10, wherein the dispense nozzle is movable with respect to the cup.

12. The apparatus of claim 1, further comprising a deflecting surface on the base of the cup below the drip trough.

13. The apparatus of claim 1, wherein the cup is substantially cylindrical.

14. The apparatus of claim 13, wherein the drip trough comprises a substantially annular trough immediately adjacent the sidewall of the cup.

15. The apparatus of claim 13, further comprising an additional drip trough, the drip troughs comprising respective substantially semi-annular troughs immediately adjacent the sidewall of the cup, the semi-annular troughs having respective drip catching surfaces facing the open top and extending from the sidewall of the cup.

16. The apparatus of claim 15, wherein the drip troughs further include a plurality of holes in the drip catching surfaces.

17. The apparatus of claim 16, wherein the holes are positioned adjacent the sidewall of the cup.

18. A photoresist drip catching apparatus, comprising:
   (a) a photoresist development cup defined by a base, a sidewall, and an open top opposite the base;
   (b) a wafer holder on the base of the photoresist development cup;
   (c) a drip trough connected to the sidewall of the photoresist development cup, the drip trough comprising a sidewall and a drip catching surface extending from the sidewall of the drip trough to the open top of the photoresist development cup.

19. The apparatus of claim 18, further comprising a dispense nozzle capable of being positioned to dispense a developer solution onto the wafer holder.

20. The apparatus of claim 19, wherein the dispense nozzle is movable with respect to the photoresist development cup.

21. The apparatus of claim 18, wherein the drip trough further includes at least one hole in the drip catching surface.

22. The apparatus of claim 21, wherein the at least one hole is positioned adjacent the sidewall of the drip trough.

23. The apparatus of claim 21, further comprising a drain line connected to the at least one hole.

24. The apparatus of claim 18, wherein the drip catching surface forms an acute angle with the sidewall of the drip trough.

25. The apparatus of claim 18, wherein the wafer holder is adapted to support a semiconductor wafer.

26. The apparatus of claim 25, further comprising a developer dispense nozzle capable of being positioned to dispense a photoresist developer solution onto the semiconductor wafer.

27. The apparatus of claim 26, wherein the developer dispense nozzle is movable with respect to the photoresist development cup.

28. The apparatus of claim 18, further comprising a deflecting surface on the base of the cup below the drip trough.

29. The apparatus of claim 18, wherein the drip trough comprises a substantially annular trough immediately adjacent the sidewall of the photoresist development cup.

30. The apparatus of claim 18, further comprising an additional drip trough, the drip troughs comprising respective substantially semi-annular troughs immediately adjacent the sidewall of the photoresist development cup, the semi-annular troughs comprising respective sidewalls and drip catching surfaces facing the open top of the photoresist development cup and extending from the sidewalls of the respective drip troughs.

31. The apparatus of claim 30, wherein the drip troughs further include a plurality of holes in the drip catching surfaces.

32. The apparatus of claim 31, wherein the holes are positioned adjacent the sidewalls of the drip troughs.

33. The apparatus of claim 18, wherein the photoresist development cup is substantially cylindrical.

34. An apparatus for applying a photoresist developer solution to a semiconductor wafer, comprising:
   (a) a photoresist development cup defined by a base, a sidewall and an open top;
   (b) a wafer holder on the base of the photoresist development cup adapted to support the semiconductor wafer;
   (c) a drip trough connected to the sidewall of the photoresist development cup, the drip trough comprising a sidewall and a drip catching surface extending from the sidewall of the drip trough to the open top of the photoresist development cup; and
   (d) a developer dispense nozzle capable of being positioned to dispense the photoresist developer solution onto the semiconductor wafer.

35. The apparatus of claim 34, wherein the developer dispense nozzle is movable with respect to the photoresist development cup.

36. The apparatus of claim 34, wherein the drip trough further includes at least one hole in the drip catching surface positioned to drain the photoresist developer solution.

37. The apparatus of claim 36, wherein the at least one hole is positioned adjacent the sidewall of the drip trough.

38. The apparatus of claim 36, further comprising a drain line connected to the least one hole.

39. The apparatus of claim 34, wherein the drip catching surface forms an acute angle with the sidewall of the drip trough.

40. The apparatus of claim 34, further comprising a deflecting surface on the base of the cup below the drip trough.

41. The apparatus of claim 34, wherein the photoresist development cup is substantially cylindrical.

42. The apparatus of claim 41, wherein the drip trough comprises a substantially annular trough immediately adjacent the sidewall of the photoresist development cup.

43. The apparatus of claim 41, further comprising an additional drip trough, the drip troughs comprising respective substantially semi-annular troughs immediately adjacent the sidewall of the photoresist development cup, the semi-annular troughs comprising respective sidewalls and drip catching surfaces facing the open top of the photoresist development cup and extending from the sidewalls of the respective drip troughs.

44. The apparatus of claim 43, wherein the drip troughs further include a plurality of holes in the drip catching surfaces positioned to drain the photoresist developer solution.

45. The apparatus of claim 44, wherein the holes are positioned adjacent the sidewalls of the drip troughs.

46. A photoresist drip catching apparatus, comprising:
(a) a photoresist development cup defined by a base, a sidewall and an open top;
(b) a wafer holder on the base of the photoresist development cup;
(c) a drip trough connected to the sidewall of the photoresist development cup, the drip trough having a drip catching surface facing the open top and extending from the sidewall of the photoresist development cup, the drip trough further including at least one hole in the drip catching surface.

47. The apparatus of claim 46, further comprising a developer dispense nozzle capable of being positioned to dispense a photoresist developer solution onto the wafer holder.

48. The apparatus of claim 47, wherein the developer dispense nozzle is movable with respect to the photoresist development cup.

49. The apparatus of claim 46, wherein the at least one hole is positioned adjacent the sidewall of the photoresist development cup.

50. The apparatus of claim 46, further comprising a drain line connected to the least one hole.

51. The apparatus of claim 46, wherein the drip catching surface forms an acute angle with the sidewall of the photoresist development cup.

52. The apparatus of claim 46, wherein the drip catching surface is positioned to extend upward from the sidewall to the open top of the photoresist development cup.

53. The apparatus of claim 46, wherein the wafer holder is adapted to support a semiconductor wafer.

54. The apparatus of claim 53, further comprising a developer dispense nozzle capable of being positioned to dispense a photoresist developer solution onto the semiconductor wafer.

55. The apparatus of claim 54, wherein the developer dispense nozzle is movable with respect to the photoresist development cup.

56. The apparatus of claim 46, further comprising a deflecting surface on the base of the cup below the drip trough.

57. The apparatus of claim 46, wherein the photoresist development cup is substantially cylindrical.

58. The apparatus of claim 57, wherein the drip trough comprises a substantially annular trough immediately adjacent the sidewall of the photoresist development cup.

59. The apparatus of claim 58, further comprising an additional drip trough, the drip troughs comprising respective substantially semi-annular troughs immediately adjacent the sidewall of the photoresist development cup, the semi-annular troughs having respective drip catching surfaces facing the open top and extending from the sidewall of the photoresist development cup.

60. A photoresist drip catching apparatus, comprising:
(a) a substantially cylindrical photoresist development cup defined by a base, a sidewall substantially perpendicular to the base, and an open top opposite the base;
(b) a wafer holder on the base of the photoresist development cup; and
(c) two substantially semi-annular drip troughs connected to the sidewall of the photoresist development cup, the drip troughs having respective drip catching surfaces facing the open top and extending from the sidewall of the photoresist development cup, the drip troughs further including a plurality of holes in the drip catching surfaces.

61. The apparatus of claim 60, further comprising a developer dispense nozzle capable of being positioned to dispense a photoresist developer solution onto the wafer holder.

62. The apparatus of claim 61, wherein the developer dispense nozzle is movable with respect to the photoresist development cup.

63. The apparatus of claim 60, wherein the holes are positioned adjacent the sidewall of the photoresist development cup.

64. The apparatus of claim 60, further comprising a plurality of drain lines connected to the plurality of holes.

65. The apparatus of claim 60, wherein the drip catching surfaces form acute angles with the sidewall of the photoresist development cup.

66. The apparatus of claim 60, wherein the drip catching surfaces are positioned to extend upward from the sidewall to the open top of the photoresist development cup.

67. The apparatus of claim 60, wherein the wafer holder is adapted to support a semiconductor wafer.

68. The apparatus of claim 67, further comprising a developer dispense nozzle capable of being positioned to dispense a photoresist developer solution onto the semiconductor wafer.

69. The apparatus of claim 68, wherein the developer dispense nozzle is movable with respect to the photoresist development cup.

70. The apparatus of claim 60, further comprising a deflecting surface on the base of the cup below the drip trough.

71. An apparatus for applying a photoresist developer solution to a semiconductor wafer, comprising:
(a) a substantially cylindrical photoresist development cup defined by a base, a sidewall substantially perpendicular to the base, and an open top opposite the base;
(b) a wafer holder on the base of the photoresist development cup adapted to support the semiconductor wafer;
(c) a drip trough connected to the sidewall of the photoresist development cup, the drip trough having a drip catching surface facing the open top and extending from the sidewall of the photoresist development cup, the drip trough further including at least one hole in the drip catching surface positioned to drain the photoresist developer solution; and
(d) a developer dispense nozzle movable with respect to the photoresist development cup and capable of being positioned to dispense the photoresist developer solution onto the semiconductor wafer.

72. The apparatus of claim 71, wherein the at least one hole is positioned adjacent the sidewall of the photoresist development cup.

73. The apparatus of claim 71, further comprising a drain line connected to the least one hole.

74. The apparatus of claim 71, wherein the drip catching surface forms an acute angle with the sidewall of the photoresist development cup.

75. The apparatus of claim 71, wherein the drip catching surface is positioned to extend upward from the sidewall to the open top of the photoresist development cup.

76. The apparatus of claim 71, further comprising a deflecting surface on the base of the cup below the drip trough.

77. The apparatus of claim 71, wherein the drip trough comprises a substantially annular trough immediately adjacent the sidewall of the photoresist development cup.

78. The apparatus of claim 71, further comprising an additional drip trough, the drip troughs comprising respective substantially semi-annular troughs immediately adjacent the sidewall of the photoresist development cup, the semi-annular troughs having respective drip catching surfaces facing the open top and extending from the sidewall of the photoresist development cup.

79. A photoresist drip catch, comprising a substantially annular trough comprising a sidewall and a drip catching surface immediately connected to and forming an acute angle with the sidewall.

80. The drip catch of claim 79, wherein the annular trough further includes at least one hole in the drip catching surface adjacent the sidewall.

81. A photoresist drip catch, comprising two substantially semi-annular troughs connected to each other, the semi-annular troughs comprising respective sidewalls and drip catching surfaces immediately connected to the respective sidewalls, the drip catching surfaces forming acute angles with the respective sidewalls.

82. The drip catch of claim 81, wherein the semi-annular troughs further include a plurality of holes in the drip catching surfaces adjacent the respective sidewalls.

* * * * *